United States Patent [19]
Hirano

[11] Patent Number: 6,160,735
[45] Date of Patent: Dec. 12, 2000

[54] NEGATIVE VOLTAGE LEVEL SHIFTER CIRCUIT AND NONVIOLATILE SEMICONDUCTOR STORAGE DEVICE INCLUDING THE CIRCUIT

[75] Inventor: Yasuaki Hirano, Yamatokooriyama, Japan

[73] Assignee: Sharp Kabushiki Kaisha, Osaka, Japan

[21] Appl. No.: 09/455,810

[22] Filed: Dec. 7, 1999

[30] Foreign Application Priority Data

Dec. 7, 1998 [JP] Japan ................................. 10-346830

[51] Int. Cl.[7] ............................................... G11C 16/04
[52] U.S. Cl. ............................ 365/185.18; 365/189.11; 365/226
[58] Field of Search .................... 365/185.18, 189.11, 365/189.01, 226, 185.01

[56] References Cited

U.S. PATENT DOCUMENTS

| | | | |
|---|---|---|---|
| 5,058,063 | 10/1991 | Wada et al. | 365/185.18 |
| 5,973,967 | 10/1999 | Nguyen et al. | 365/189.05 |

FOREIGN PATENT DOCUMENTS 9-320282  12/1997  Japan .

*Primary Examiner*—David Nelms
*Assistant Examiner*—Hoai V. Ho
*Attorney, Agent, or Firm*—Morrison & Foerster, LLP

[57] ABSTRACT

Between a first negative voltage level shifter which is made up of transistors having a normal breakdown voltage and which shifts an input signal of a level Vcc or Vss to a level Vcc or Vnmin, and a second negative voltage level shifter which is made up of transistors having a normal breakdown voltage and which shifts an input signal of a level Vnmin or Vss to a level Vss or Vneg, is provided an inverter 8 for converting the level Vcc or Vnmin derived from the first negative voltage level shifter to the level Vnmin or Vss and then feeds the resulting voltage level to the second negative voltage level shifter. Vnmin, which is an intermediate level between Vss and Vneg, is set so that the maximum voltage difference of voltages applied to the transistors of the first negative voltage level shifter becomes equal to or smaller than the breakdown voltage. Thus, an output of Vneg (Vss–breakdown voltage of transistors of second negative voltage level shifter) lower in level than the conventional Vneg (Vcc–Vss–breakdown voltage) is obtained. As a result, the absolute value of the outputted negative voltage can be increased without increasing the breakdown voltage of the transistors.

5 Claims, 4 Drawing Sheets

NEGATIVE VOLTAGE LEVEL SHIFTER CIRCUIT AND NONVIOLATILE SEMICONDUCTOR STORAGE DEVICE INCLUDING THE CIRCUIT

BACKGROUND OF THE INVENTION

The present invention relates to a negative voltage level shifter circuit for shifting the voltage level of an input signal to a negative voltage level.

Devices that use voltages different from the voltage of an input signal are exemplified by flash memories (batch erase type memories) and EPROMs (Erasable Programmable Read Only Memories) and the like. In such a device, it is necessary to shift the voltage level of an input signal to a high voltage or negative voltage. Circuits that shift the voltage level of an input signal like this are referred to as level shifter circuits, and among these, circuits which shift a voltage level to a negative voltage are referred to as negative voltage level shifter circuits. In addition, the negative voltage to which a negative voltage level shifter circuit shifts a voltage level is, for example, −8 V, −10 V, −12 V or the like.

A negative voltage level shifter circuit according to the prior art is disclosed in Japanese Patent Laid-Open Publication HEI 9-320282 (FIG. 4). Below described is operation of this negative voltage level shifter circuit with reference to FIG. 4. First, when a signal of a level Vcc is inputted as an input signal "in", a transistor P1 turns off. Further, as a result of level inversion of the input signal "in" by an inverter inv1, a transistor P2 turns on, so that the level of an output signal "out" rises to Vcc. Then, a transistor N1 turns on, causing a transistor N2 to turn off. Therefore, the output signal "out" is fixed to Vcc.

When a signal of a level Vss (e.g., 0 V) is inputted as the input signal "in", the transistor P1 turns on. Further, since the level of the input signal "in" is inverted by the inverter inv1 so that Vcc is outputted, the transistor P2 turns off. Meanwhile, by the transistor P1 turning on, the transistor N2 turns off and the transistor N1 turns off. As a result, the level of the output signal "out" is pulled down to Vneg (e.g., −9 V).

Thus, the level Vcc or Vss of the input signal "in" is shifted to the level Vcc or Vneg and outputted as the output signal "out".

However, the negative voltage level shifter circuit of the prior art described above has the following problems. That is, in the case of this negative voltage level shifter circuit, since the level Vcc or Vss of the input signal "in" is shifted to the level Vcc or Vneg as described above, the transistor N1 turns on when the input signal "in" of the level Vcc is inputted. On this account, the negative voltage Vneg is applied to the drain of the transistor P1 while the power supply voltage Vcc is applied to its source. In this case, the maximum value of the voltage applied to the transistor P1 is −Vneg+Vcc. Given here that Vneg is −9 V and that Vcc is 3 V, then the transistor P1 is required to have a breakdown voltage of 12 V.

The breakdown voltage of a transistor, although depending also on the oxide layer thickness of the transistor, generally decreases as the size of the transistor decreases. Accordingly, along with advances of microstructure and downsizing of memory cells, the array pitch of transistors or the like constituting the decoder decreases so that the transistors are also necessarily downsized resultantly. Therefore, there is a tendency that the breakdown voltage of transistors constituting the decoder decreases with the recent micro-miniaturization of semiconductor storage devices.

Meanwhile, in flash memories, there has been a growing demand for higher programming speed and erasing speed. Below described is the method for enhancing these speeds. FIG. 5 shows a cell structure of a flash memory cell. A flash memory cell comprises a gate portion composed of a control gate 101 and a floating gate 102 with an interlayer insulator 100 interposed therebetween, a source portion 105 and a drain portion 106 located on both sides of the gate portion in a substrate 104 with tunnel oxide 103 interposed therebetween. Below described is the operation of a flash memory (FN—FN type flash memory) that uses the FN (Fowler-Nordheim) tunneling phenomenon for programming operation and erasing operation with memory cells as described above.

For programming, Vneg (e.g., −9 V) is applied to the control gate 101 while Vpd (e.g., 5 V) is applied to the drain portion 106. Then, the FN tunneling phenomenon occurs on the drain side, causing electrons to be pulled out from the floating gate 102, so that the threshold value of the transistor forming the memory cell goes lower, thus information being written therein. For erasing, on the other hand, Vpp (e.g., 12 V) is applied to the control gate 101 while Vneg (e.g., −9 V) is applied to the drain portion 106, the source portion 105 and the substrate 104. Then, the FN tunneling phenomenon occurs in the channel layer, causing electrons to be injected into the floating gate 102, so that the threshold value of the transistor forming the memory cell goes higher, thus information being erased. Applied voltage conditions for each operation of the above-described programming and erasing operations plus reading operation are collectively shown in Table 1:

TABLE 1

|  | Control gate 101 | Drain 106 | Source 105 | Substrate 104 |
| --- | --- | --- | --- | --- |
| Programming | −9 V | 5 V | F | 0 V |
| Erasing | 12 V | −9 V | −9 V | −9 V |
| Reading | 3 V | 1 V | 0 V | 0 V |

F: Floating state

Also, in the case of a flash memory (ETOX type flash memory) that uses channel hot electrons for programming and erasing operations, for programming, Vpp (e.g., 12 V) is applied to the control gate while Vpd (e.g., 5 V) is applied to the drain. Then, with the source at Vss (e.g., 0 V), a current flows in the channel layer, causing channel hot electrons to be generated around the drain. Further, electrons are injected into the floating gate, so that the threshold value of the transistor forming the memory cell goes higher, thus information being written therein. For erasing, on the other hand, Vneg (e.g., −9 V) is applied to the control gate while Vpd (e.g., 5 V) is applied to the drain. Then, the FN tunneling phenomenon occurs on the drain side, causing electrons to be pulled out from the floating gate, so that the threshold value of the transistor forming the memory cell goes lower, thus information being erased. That is, the operation for erasing is similar to the foregoing programming operation of the FN—FN type flash memory. Applied voltage conditions for each operation of the above-described programming and erasing operations plus reading operation are collectively shown in Table 2:

TABLE 2

|  | Control gate 101 | Drain 106 | Source 105 | Substrate 104 |
|---|---|---|---|---|
| Programming | 12 V | 5 V | 0 V | 0 V |
| Erasing | −9 V | 5 V | F | 0 V |
| Reading | 3 V | 1 V | 0 V | 0 V |

F: Floating state

Here is discussed a method for enhancing the speed of programming characteristics of the FN—FN type flash memory. FIG. 6 shows an example of the programming characteristics of the FN—FN type flash memory, showing a relationship between voltage application time to the control gate 101 and the threshold value of the transistor forming the memory cell (hereinafter, referred to simply as memory cell threshold) in the case where the voltage applied to the control gate 101 is changed to −8 V, −10 V and −12 V. As can be seen from the figure, increasing the absolute value of the negative voltage applied to the control gate 101 allows the programming speed to be enhanced. It is noted that applying a negative voltage to the control gate 101 corresponds to erasing in the case of the ETOX type flash memory. Therefore, for the ETOX type flash memory, the erasing speed can be enhanced by increasing the absolute value of the negative voltage applied to the control gate.

However, as described above, there has been a tendency in recent years that the breakdown voltage lowers, whereas there is an issue that negative voltage level shifters capable of supplying a negative voltage of a high absolute value to the control gate of the memory cell have not yet been provided, which makes it unrealizable to enhance the programming speed of the FN—FN type flash memory or the erasing speed of the ETOX type flash memory. For example, in the conventional negative voltage level shifter shown in FIG. 4, given that the breakdown voltage of its constituent transistors P1, P2, N1 and N2 is 12 V, then breakdown voltage=−Vneg +Vcc.

Therefore, if the power supply voltage Vcc is 3 V, then $$Vneg = Vcc - breakdown\ voltage$$
$$= 3\,V - 12\,V$$
$$= -9\,V$$

so that only −9 V can be supplied. Consequently, according to FIG. 6, there is an issue that the flash memory, although capable of enhancing the programming speed or the erasing speed by applying a voltage of −12 V to its control gate, is disabled from exerting the capability.

Accordingly, an object of the present invention is to provide a negative voltage level shifter circuit capable of increasing the absolute value of an outputted negative voltage without increasing the breakdown voltage of the constituent transistors, as well as a nonvolatile semiconductor storage device using this negative voltage level shifter circuit.

In order to achieve the aforementioned object, there is provided a negative voltage level shifter circuit for shifting an input signal of either a power supply voltage level or a reference voltage level to either the reference voltage level or a first negative voltage level, comprising:

first shift means which comprises a latch circuit and an inverter, the latch circuit being made up of two n-MOS transistors and two p-MOS transistors, and which shifts an input signal of the power supply voltage level to the power supply voltage level and shifts an input signal of the reference voltage level to a second negative voltage level;

second shift means which comprises a latch circuit and an inverter, the latch circuit being made up of two n-MOS transistors and two p-MOS transistors, and which shifts the second negative voltage level to the reference voltage level and shifts the reference voltage level to the first negative voltage level; and an inverter which shifts the power supply voltage level obtained by the first shift means to the second negative voltage level and shifts the second negative voltage level obtained by the first shift means to the reference voltage level and then feeds the resulting voltage level to the second shift means.

With this constitution, the second negative voltage level Vnmin is set to an intermediate level between the reference voltage level Vss and the first negative voltage level Vneg, and a level shift is performed in two steps by two shift means having the same constitution via the second negative voltage level Vnmin. Thus, a negative voltage large in absolute value can be obtained by the two shift means having the same circuit construction as the conventional counterpart without using any special circuit construction.

Also, there is provided a negative voltage level shifter circuit for shifting an input signal of either a power supply voltage level or a reference voltage level to either the reference voltage level or a first negative voltage level, comprising:

first shift means which comprises a latch circuit, an inverter and a p-MOS transistor that inhibits a second negative voltage from being biased forward, the latch circuit being made up of two n-MOS transistors and one p-MOS transistor, and which shifts an input signal of the power supply voltage level to the power supply voltage level and shifts an input signal of the reference voltage level to the second negative voltage level; and second shift means which comprises a latch circuit, an inverter and a p-MOS transistor that inhibits the second negative voltage from being biased forward, the latch circuit being made up of two n-MOS transistors and one p-MOS transistor, and which shifts the power supply voltage level to the reference voltage level and shifts the second negative voltage level to the first negative voltage level.

With this constitution, the second negative voltage level Vnmin is set to an intermediate level between the reference voltage level Vss and the first negative voltage level Vneg, and a level shift is performed in two steps by two shift means having the same constitution via the second negative voltage level Vnmin. Thus, a negative voltage large in absolute value can be obtained without using any special circuit construction.

In one embodiment of the present invention, the second negative voltage is so set as to have an absolute value equal to or smaller than a difference between an absolute value of a breakdown voltage of the transistors constituting the first shift means and an absolute value of the power supply voltage.

With this constitution, even if the breakdown voltage of the transistors constituting the first shift means is a breakdown voltage of ordinary transistors that have conventionally been used, a negative voltage large in absolute value can be obtained by the two-step level shift.

In one embodiment of the present invention, the second negative voltage is obtained by a threshold reduction of at least one of the p-MOS transistors connected in series to each other.

With this constitution, the second negative voltage Vnmin can be obtained at low current consumption and with a simple circuit construction, without using any additional power supply for generation of the second negative voltage.

Also, there is provided a nonvolatile semiconductor storage device comprising the negative voltage level shifter circuit as defined in claim 1.

With this constitution, by using a negative voltage level shifter which, even if made up of transistors having a low breakdown voltage, is capable of obtaining a negative voltage large in absolute value, the nonvolatile semiconductor storage device can be reduced in size and enhanced in programming speed and erasing speed.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
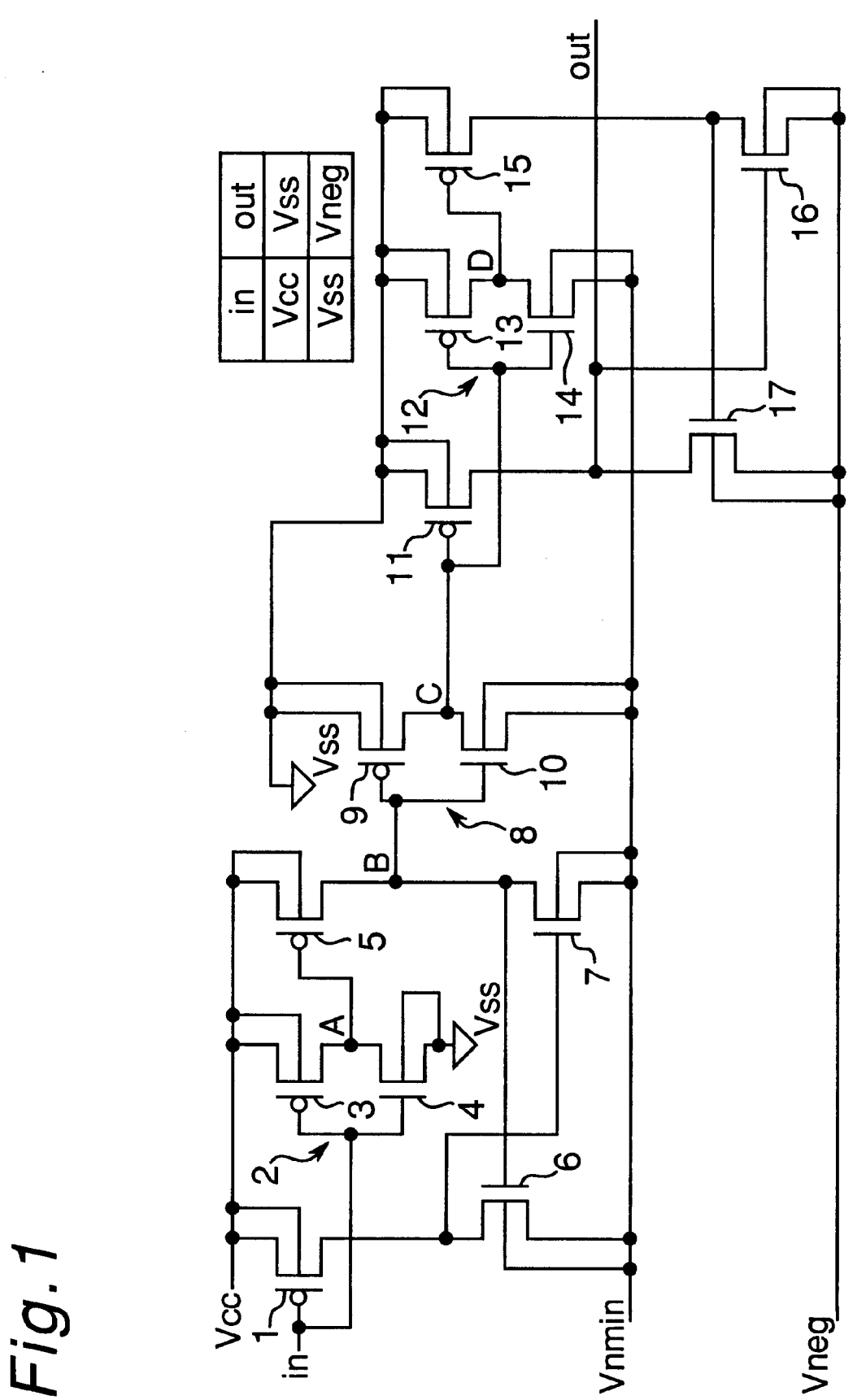
FIG. 1 is a circuit diagram showing an example of a negative voltage level shifter circuit according to the present invention.

Hereinbelow, the present invention is described in detail by way of embodiments thereof illustrated in the accompanying drawings. FIG. 1 is a circuit diagram of a negative voltage level shifter circuit in this embodiment. An input terminal "in" is connected to the gate of a p-MOS transistor 1 and the gates of a p-MOS transistor 3 and an n-MOS transistor 4 constituting an inverter 2. The source of the p-MOS transistor 3 constituting the inverter 2 is connected to a power supply voltage Vcc, while the source of the n-MOS transistor 4 is connected to a reference voltage Vss. Also, the drains of the two MOS transistors 3, 4 are connected to each other to form a node A. Then, this node A is connected to the gate of a p-MOS transistor 5. The source of the p-MOS transistor 5 is connected to the power supply voltage Vcc, while the drain is connected to the gate of an n-MOS transistor 6 and the drain of an n-MOS transistor 7 to form a node B.

The sources of the two n-MOS transistor 6, 7 are connected to a second negative voltage Vnmin. Also, the source of the p-MOS transistor 1 is connected to the power supply voltage Vcc while the drain is connected to the drain of the n-MOS transistor 6 and the gate of the n-MOS transistor 7.

The node B is connected to the gates of a p-MOS transistor 9 and an n-MOS transistor 10 constituting an inverter 8. Also, the source of the p-MOS transistor 9 is connected to the reference voltage Vss while the source of the n-MOS transistor 10 is connected to the second negative voltage Vnmin. Further, the drains of the two MOS transistors 9, 10 are connected to each other to form a node C.

The node C is connected to the gate of a p-MOS transistor 11. Further, the node C is connected to the gates of a p-MOS transistor 13 and an n-MOS transistor 14 constituting an inverter 12. Also, the drains of the two transistors 13, 14 are connected to each other to form a node D. Then, this node D is connected to the gate of a p-MOS transistor 15. Further, the drain of the p-MOS transistor 15 is connected to the drain of an n-MOS transistor 16 and the gate of an n-MOS transistor 17. The drain of the p-MOS transistor 11 is connected to the drain of the n-MOS transistor 17 and the gate of the n-MOS transistor 16, and also leads to an output terminal "out".

The sources of the p-MOS transistor 11 as well as of the p-MOS transistor 13 and the p-MOS transistor 15 constituting the inverter 12 are connected to a reference voltage Vss. Also, the source of the n-MOS transistor 14 constituting the inverter 12 is connected to the second negative voltage Vnmin, while the sources of the n-MOS transistor 17 and the n-MOS transistor 16 are connected to a first negative voltage Vneg.

Now, with reference to FIG. 1, operation of the negative voltage level shifter circuit in this embodiment is explained. When a signal of the level Vcc is inputted to the input terminal "in", the level of the input signal is inverted by the inverter 2 so that the voltage of the node A goes Vss. Therefore, the p-MOS transistor 5 turns on and the voltage of the node B is pulled up to the Vcc level. As a result of this, the n-MOS transistor 6 turns on. Meanwhile, because the p-MOS transistor 1 is off, the gate of the n-MOS transistor 7 goes the Vnmin level so that the n-MOS transistor 7 turns off. Thus, the voltage of the node B is fixed to the Vcc level.

Subsequently, the p-MOS transistor 9 of the inverter 8 turns off while the n-MOS transistor 10 turns on, so that the voltage of the node C goes the Vnmin level. Therefore, the p-MOS transistor 13 of the inverter 12 turns on while the n-MOS transistor 14 turns off, so that the is voltage of the node D goes the Vss level. As a result, the p-MOS transistor 15 turns off. Meanwhile, the p-MOS transistor 11 turns on, causing the voltage of the output terminal "out" to be pulled up to Vss. Further, because the n-MOS transistor 16, to the gate of which Vss is inputted, turns on, the gate voltage of the n-MOS transistor 17 goes Vneg, so that the n-MOS transistor 17 turns off. Thus, the output level of the output terminal "out" is fixed to Vss.

Next described is the operation in the case where a signal of a level Vss is inputted. In this case, the input signal is inverted by the inverter 2, so that the voltage of the node A goes the Vcc level, causing the p-MOS transistor 5 to turn off. Meanwhile, the p-MOS transistor 1 has turned on. Therefore, the gate of the n-MOS transistor 7 goes the Vcc level, so that the n-MOS transistor 7 turns on. As a result of this, the voltage level of the node B goes Vnmin. Further, the n-MOS transistor 6 turns off, so that the voltage level of the node B is fixed to Vnmin.

The voltage level of the node B, while being inverted by the inverter 8, is shifted, so that the voltage level of the node C goes Vss. The voltage level of this node C is inverted by the inverter 12, so that the voltage level of the node D goes Vnmin. Therefore, the p-MOS transistor 15 turns on, causing the gate voltage of the n-MOS transistor 17 to rise to the Vss level so that the n-MOS transistor 17 turns on. Meanwhile, because the p-MOS transistor 11 is off, the voltage level of the output terminal "out" goes Vneg. Also, because the gate voltage of the n-MOS transistor 16 is at the Vneg level, the n-MOS transistor 16 turns off so that the voltage level of the output terminal "out" is fixed to Vneg.

In addition, as apparent from the above description, the four devices of the p-MOS transistors 1, 5 and the n-MOS transistors 6, 7 as well as the four devices of the p-MOS transistors 11, 15 and the n-MOS transistors 16, 17 constitute latch circuits, respectively. As a result, against voltage fluctuations and noise of the input signal to the input terminal "in", a fluctuation-free, stable output signal derived from the output terminal "out" can be produced.

As described above, according to this embodiment, the level of the input signal Vcc can be shifted to the level of the output signal Vss, while the level of the input signal Vss can be shifted to the level of the output signal Vneg. In this case, if the breakdown voltage Vmax of the individual transistors is 12 V, then the maximum voltage difference of voltages applied to the transistors needs to be suppressed to below 12 V.

Now, for example regarding the p-MOS transistor 5, the maximum voltage difference of voltages applied to the p-MOS transistor 5 is |Vcc|+|Vnmin|. Accordingly, in order to hold the maximum voltage difference of voltages applied to the p-MOS transistor 5 below the breakdown voltage Vmax, it is necessary to satisfy the relation of Equation (1):

$$|Vcc|+|Vnmin|<|Vmax| \quad (1)$$

That is, as the voltage of the voltage Vnmin, a value that satisfies the relation of Equation (2) should be selected:

$$|Vnmin|<|Vmax|-|Vcc| \quad (2)$$

That is, if the breakdown voltage Vmax of the p-MOS transistor 5 is 12 V and if the power supply voltage Vcc is 3 V, then a voltage of about −5 V may appropriately be selected as the second negative voltage Vnmin.

Figure 2:
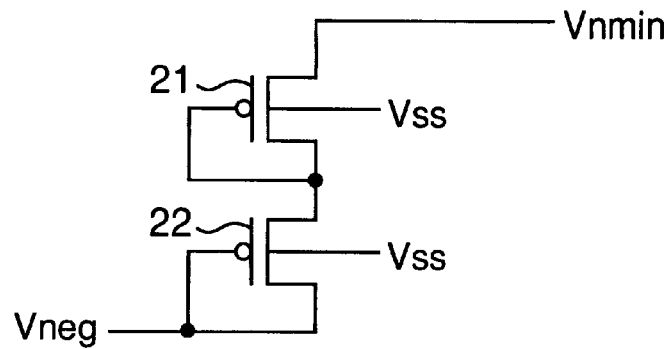
FIG. 2 is a diagram showing an example of a Vnmin generating circuit.

Although the second negative voltage Vnmin may also be generated, for example, by resistor-division of the power supply voltage Vcc and the first negative voltage Vneg, yet it is also possible to generate the second negative voltage Vnmin from the first negative voltage Vneg by threshold reduction of p-MOS transistors 21, 22 as shown in FIG. 2. In this case, the second negative voltage Vnmin is $$Vnmin=Vneg+A \times |Vthp|$$

where A is the number of serial connection stages of p-MOS transistors connected to one another at gate and drain (A=2 in FIG. 2), and Vthp is the threshold value of the p-MOS transistors.

In addition, the threshold value Vthp of the p-MOS transistors can be set to a desired value by selecting a channel length or a gate width, or by setting the potential of the channel region, but this is a known technique and so omitted here in description.

In FIG. 2, the p-MOS transistors 21, 22 with gate and drain connected to each other are connected in series, by which a Vnmin generating circuit is implemented. Also, by using the reference voltage Vss as the voltage of the channel region of the p-MOS transistors 21, 22, a simple circuit construction is realized without preparing any additional power supply. Thus, Vnmin (around −5 V) is generated from Vneg. Further, according to this circuit construction, unlike the case in which the voltage is generated by resistor-division of the power supply voltage Vcc and the first negative voltage Vneg as described above, unnecessary current consumption in the Vnmin generating circuit can be avoided.

In the way described above, by the setting of the second negative voltage Vnmin, whereas the level of the input signal is Vcc or Vss, the signal level at the node B is shifted to the level Vcc or Vnmin. In this case, if Vcc is 3 V and Vnmin is −5 V, then the voltage difference Vcc−Vnmin is 8 V. Therefore, with respect to the p-MOS transistor 5, the maximum voltage difference Vcc−Vnmin of the applied voltages is 8 V, thus operation being enabled at voltages lower than the breakdown voltage 12 V of the transistors.

Next, the signal level Vcc or Vnmin at the node B is shifted to the level Vnmin or Vss at the node C by the inverter 8. Further, the signal level Vnmin or Vss at the node C is shifted to the level Vss or Vneg at the output terminal "out". As a result, the maximum voltage difference of the voltages applied to, for example, the p-MOS transistor 15 is (Vss−Vneg). Therefore, given that Vss is 0 V, when the breakdown voltage Vmax of the p-MOS transistor 15 is 12 V, an output signal Vneg of up to −12 V can be obtained from an equation that 12 V=0 V−Vneg.

As described above, in this embodiment, two negative voltage level shifters are provided, and each negative voltage level shifter comprises the p-MOS transistor 1, 11 with its gate connected to the input terminal "in", the node C, respectively, the inverter 2, 12 with its input side connected to the input terminal "in", the node C, respectively, the p-MOS transistor 5, 15 with its gate connected to the output side of the inverter 2, 12, respectively, the n-MOS transistor 6, 17 with its gate connected to the drain of the p-MOS transistor 5, 15, respectively, and the n-MOS transistor 7, 16 with its drain connected to the drain of the p-MOS transistor 5, 15 and with its gate connected to the drain of the p-MOS transistor 1, 11, respectively.

Then, one negative voltage level shifter shifts a signal of a level Vcc or Vss inputted from the input terminal "in" to a level Vcc or Vnmin. Also, the other negative voltage level shifter shifts a signal of a level Vnmin or Vss inputted from the node C to a level Vss or Vneg. In this case, the level of the power supply Vnmin is an intermediate level between a power supply voltage Vss and another power supply voltage Vneg, and is so set that the maximum voltage difference of voltages applied to the transistors constituting the one negative voltage level shifter becomes below the breakdown voltage Vmax.

Further, the inverter 8 for converting the level Vcc or Vnmin to the level Vnmin or Vss is provided between the two negative voltage level shifters, so that a signal of the level Vcc or Vnmin derived from the one negative voltage level shifter is converted into a signal of the level Vnmin or Vss and then fed to the other negative voltage level shifter.

Figure 4:
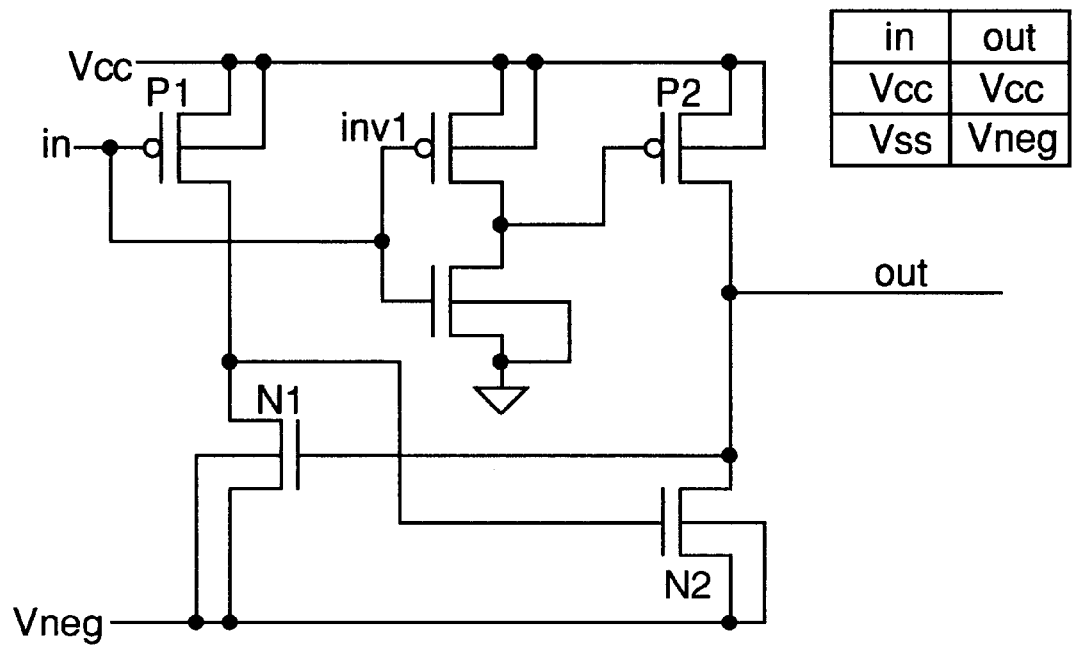
FIG. 4 is a circuit diagram of a negative voltage level shifter circuit according to the prior art.
Figure 5:
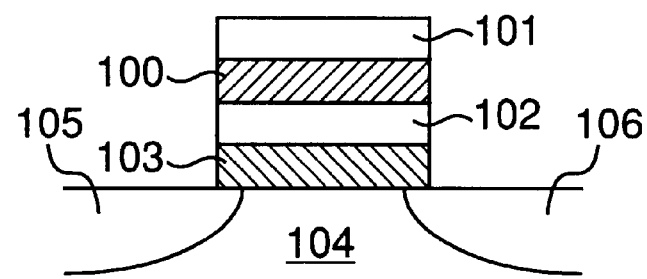
FIG. 5 is a structure explanatory view of a flash memory.
Figure 6:
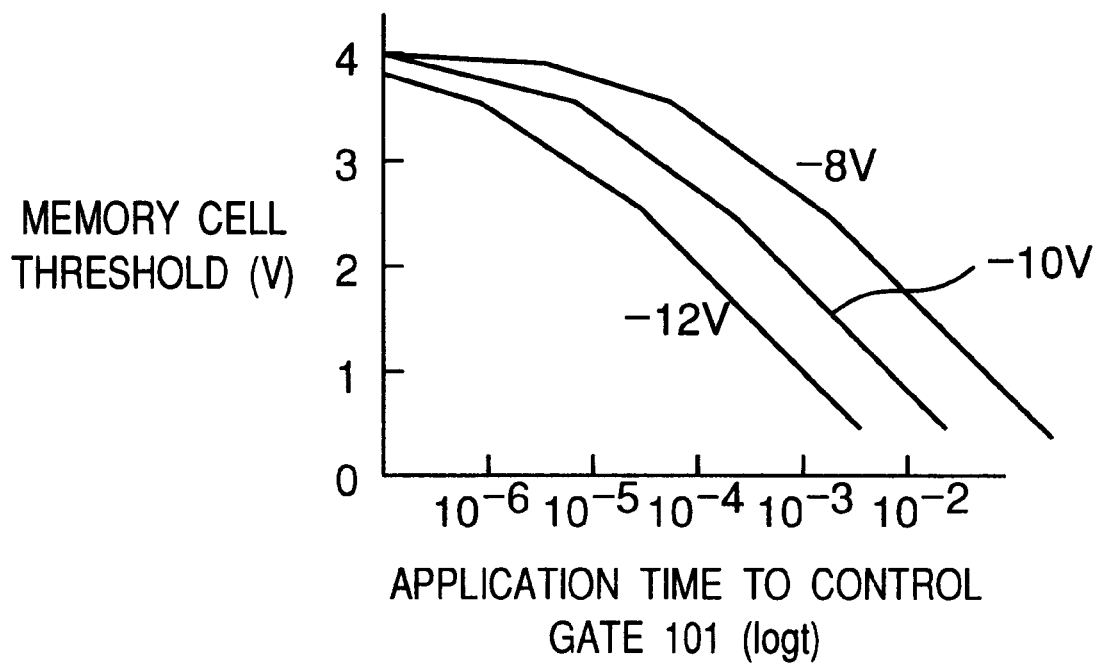
FIG. 6 is a programming characteristic chart of an FN—FN type flash memory.

In this case, each of the two negative voltage level shifters is identical in construction to the conventional negative voltage level shifter shown in FIG. 4, and the breakdown voltage of each transistor is also around the breakdown voltage of conventional transistors (e.g., 12 V). That is, in this embodiment, with the use of two units of the conventional negative voltage level shifter shown in FIG. 4, a level shift is performed in two steps to the voltage Vneg via an intermediate voltage Vnmin.

Consequently, according to the negative voltage level shifter circuit of this embodiment, when a signal of a level Vcc or Vss is inputted to the one negative voltage level shifter, the level of the signal can be shifted to an output of the level Vss or Vneg (Vss—breakdown voltage Vmax of transistors constituting the other negative voltage level shifter) from the other negative voltage level shifter. Therefore, even when the negative voltage level shifters are made up of transistors having a breakdown voltage of 12 V as in the conventional negative voltage level shifter shown in FIG. 4, the voltage Vneg that can be outputted with Vcc being 3 V and Vss being 0 V is −12 V as described above, thus making it possible to generate a negative voltage larger in absolute value than the output voltage −9 V of the conventional negative voltage level shifter shown in FIG. 4.

Therefore, according to this embodiment, enhancement in speed of the flash memory (for example, higher-speed programming for the FN—FN type flash memory) can be realized.

Also, from the viewpoint of the maximum voltage difference of voltages applied to the transistors constituting the negative voltage level shifter circuit of this embodiment, the maximum voltage difference of voltages applied to the individual transistors can be lowered for generation of the same voltage Vneg, as compared with the conventional negative voltage level shifter circuit shown in FIG. 4, by adopting the circuit construction shown in FIG. 1. In general, the circuit is increased in reliability when operated by applying a maximum voltage difference lower than the breakdown voltage Vmax to the transistors. Thus, adopting the circuit construction of this embodiment contributes to a reduction in area of the negative voltage level shifter circuit as well as to an enhancement in reliability.

(Second Embodiment)

Figure 3:
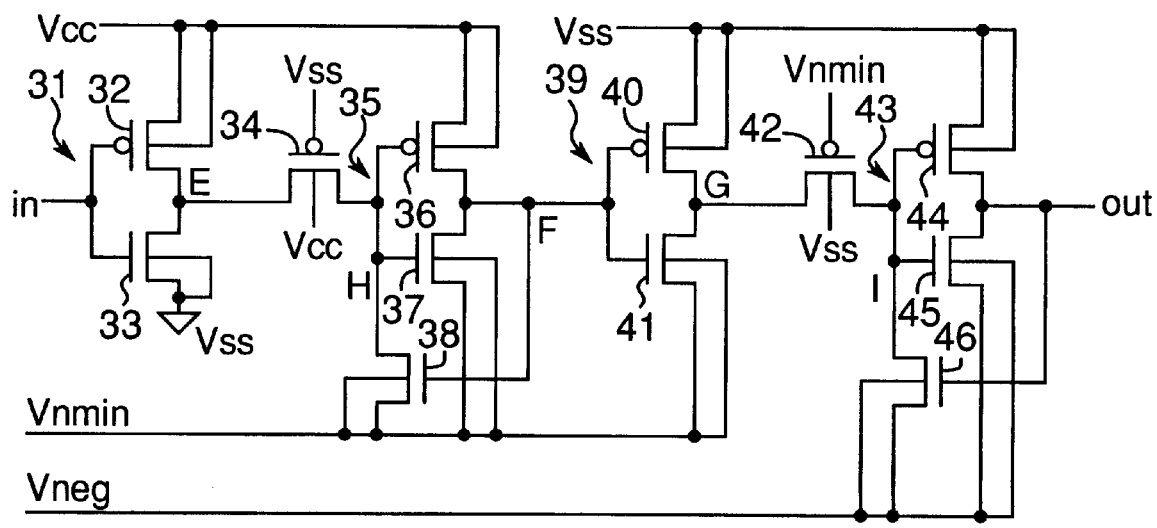
FIG. 3 is a circuit diagram of a negative voltage level shifter circuit other than FIG. 1.

FIG. 3 is a circuit diagram showing a second embodiment of the negative voltage level shifter according to the present invention.

In this embodiment, the number of transistors constituting the negative voltage level shifter circuit of the first embodiment shown in FIG. 1 is reduced, so that the layout area is reduced. First, the circuit construction in this embodiment is explained.

An input terminal "in" is connected to the gates of a p-MOS transistor 32 and an n-MOS transistor 33 constituting an inverter 31. Also, the drains of the two MOS transistors 32, 33 are connected to each other to form a node E. This node E is connected to the source of a p-MOS transistor 34, and the gate of the p-MOS transistor 34 is connected to a reference voltage Vss. Meanwhile, the drain of the p-MOS transistor 34 is connected to the gates of a p-MOS transistor 36 and an n-MOS transistor 37 constituting an inverter 35 and moreover connected to the drain of an n-MOS transistor 38. Also, the drains of the two MOS transistors 36, 37 are connected to each other to form a node F, and this node F is connected to the gate of the n-MOS transistor 38.

The sources of the p-MOS transistor 32 of the inverter 31 and the p-MOS transistor 36 of the inverter 35 are connected to a power supply voltage Vcc. Meanwhile, the source of the n-MOS transistor 33 constituting the inverter 31 is connected to a reference voltage Vss. Also, the source of the n-MOS transistor 37 constituting the inverter 35 and the source of the n-MOS transistor 38 constituting the inverter 35 are connected to a second negative voltage Vnmin.

The node F is further connected to the gates of a p-MOS transistor 40 and an n-MOS transistor 41 constituting an inverter 39. Also, the drains of the two MOS transistors 40, 41 are connected to each other to form a node G. This node G is connected to the source of a p-MOS transistor 42, and the gate of the p-MOS transistor 42 is connected to the second negative voltage Vnmin. Meanwhile, the drain of the p-MOS transistor 42 is connected to the gates of a p-MOS transistor 44 and an n-MOS transistor 45 constituting an inverter 43, and moreover connected to the drain of an n-MOS transistor 46. Also, the drains of the two MOS transistors 44, 45 are connected to each other to form an output terminal "out", and this output terminal "out" is connected to the gate of the n-MOS transistor 46.

The sources of the p-MOS transistor 40 of the inverter 39 as well as of the p-MOS transistor 44 of the inverter 43 are connected to the reference voltage Vss. Meanwhile, the source of the n-MOS transistor 41 constituting the inverter 39 is connected to the second negative voltage Vnmin. Also, the source of the n-MOS transistor 45 constituting the inverter 43 and the source of the n-MOS transistor 46 are connected to a first negative voltage Vneg.

Now, with reference to FIG. 3, operation of the negative voltage level shifter circuit in this embodiment is explained. When a signal of a level Vcc is inputted to the input terminal "in", the level of the input signal is inverted by the inverter 31 so that the voltage of the node E goes Vss. Then, the source and gate of the p-MOS transistor 34 go the same voltage Vss, so that the drain voltage of the p-MOS transistor 34 (i.e., node H) becomes higher than the source voltage by Vthp (threshold of the p-MOS transistor), resulting in (Vss+Vthp).

Now that the level of the node H has become (Vss+Vthp) in this way, the p-MOS transistor 36 of the inverter 35 almost turns on, causing the node F to be pulled up to the Vcc level. Then, the n-MOS transistor 38 turns on, causing the node H to be abruptly pulled down to the Vnmin level, so that the n-MOS transistor 37 of the inverter 35 completely turns off. Therefore, there is no through current passing through the p-MOS transistor 36 and the n-MOS transistor 37 of the inverter 35, thus the level of the node F being completely fixed to Vcc.

Then, because the node F level is Vcc, the n-MOS transistor 41 of the inverter 39 turns on, causing the node G to go the Vnmin level. From this on, in the same way as in the foregoing case, the voltage of a node I becomes (Vnmin+Vthp) by the operation of the p-MOS transistor 42. Then, the p-MOS transistor 44 of the inverter 43 almost turns on, causing the output terminal "out" to be pulled up to the Vss level. As a result, the n-MOS transistor 46 turns on, causing the node I to be abruptly pulled down to the Vneg level, so that the n-MOS transistor 45 of the inverter 43 is completely turned off. Therefore, there is no through current passing through the p-MOS transistor 44 and the n-MOS transistor 45 of the inverter 43, so that the level of the output terminal "out" is completely fixed to Vss.

Next described is the operation in the case where a signal of a level Vss (0 V in this case) is inputted to the input terminal "in". In this case, the input signal is inverted by the inverter 31, causing the node E to go the Vcc level, so that the p-MOS transistor 34 turns on, causing the node H to go the Vcc level as well. Further, the p-MOS transistor 36 of the inverter 35 turns off while the n-MOS transistor 37 turns on. Therefore, the node F goes the Vnmin level, so that the n-MOS transistor 38 turns off.

Then, because the node F level is Vnmin, the p-MOS transistor 40 of the inverter 39 turns on while the n-MOS transistor 41 turns off, causing the node G to go the Vss level. As a result, the p-MOS transistor 42 turns on, causing the node I to go the Vss level as well. Subsequently, the p-MOS transistor 44 of the inverter 43 turns off while the n-MOS transistor 45 turns on, so that the level of the output terminal "out" is pulled down to Vneg. Thus, as a result of this, the n-MOS transistor 46 is completely turned off, by which the node I level Vss and the output terminal "out" level Vneg are fixed.

In addition, as apparent from the above description, the inverter 35 and the n-MOS transistor 38, as well as the inverter 43 and the n-MOS transistor 46 form latch circuits, respectively. As a result, against voltage fluctuations and noise of the input signal to the input terminal "in", a fluctuation-free, stable output signal derived from the output terminal "out" can be produced.

As described above, according to this embodiment, the level of the input signal Vcc (3 V) can be shifted to the level of the output signal Vss (0 V), while the level of the input signal Vss (0 V) can be shifted to the level of the output signal Vneg (–12 V). In this case also, as in the case of the first embodiment, Vnmin is set to, for example, about –5 V so as to satisfy the following relation:

|Vnmin|<|Vmax|–|Vcc|.

As described above, in this embodiment, two negative voltage level shifters are provided, and each negative voltage level shifter comprises the inverter 31, 39 connected to the input terminal "in", the node F, respectively, the p-MOS transistor 34, 42 the source of which is connected to the output side of the inverter 31, 39 and to the gate of which the lower level side of the input signal is inputted, respectively, the inverter 35, 43 connected to the drain of the p-MOS transistor 34, 42, respectively, and the n-MOS transistor 38, 46 to the drain of which the input node H, I of the inverter 35, 43 is connected and to the gate of which the output node F, "out" of the inverter 35, 43 is connected, respectively.

Then, one negative voltage level shifter shifts a signal of a level Vcc or Vss inputted from the input terminal "in" to a level Vcc or Vnmin. Also, the other negative voltage level shifter shifts a signal of a level Vcc or Vnmin, which is inputted to the node F from the one negative voltage level shifter, to a level Vss or Vneg. In this case, the level of the power supply Vnmin is an intermediate level between the power supply Vss and the power supply Vneg, and is so set that the maximum voltage difference of voltages applied to the transistors constituting the one negative voltage level shifter becomes below the breakdown voltage Vmax.

That is, in this embodiment also, with the use of two negative voltage level shifters each made up of transistors having a normal breakdown voltage (e.g., 12 V), a level shift is performed in two steps to the voltage Vneg via an intermediate voltage Vnmin.

Therefore, according to the negative voltage level shifter circuit of this embodiment, even when the negative voltage level shifters are made up of transistors having a breakdown voltage of 12 V as in the conventional negative voltage level shifter shown in FIG. 4, the voltage Vneg that can be outputted is (Vss–Vmax)=0 V–12 V=–12 V, thus making it possible to generate a negative voltage larger in absolute value than the output voltage –9 V of the conventional negative voltage level shifter shown in FIG. 4.

Also, the number of devices that constitute the negative voltage level shifter circuit of this embodiment is 12, smaller than the number of devices, 14, that constitute the negative voltage level shifter circuit of the first embodiment, and thus the layout area can be reduced.

In addition, the source of a transistor as herein referred to means source or drain, and the drain means drain or source.

The voltage Vneg outputted from the negative voltage level shifter circuit in each of the embodiments as described above is applied, as a voltage described in foregoing Table 1 or 2, to the control gate of a specified memory cell or the like according to an address signal or erase signal, for example, via a word decoder or erasing circuit or the like of a flash memory unit. Then, based on this applied voltage, programming or erasing operation on the memory cell is executed at high speed.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A negative voltage level shifter circuit for shifting an input signal of either a power supply voltage level or a reference voltage level to either the reference voltage level or a first negative voltage level comprising:

first shift means which comprises a latch circuit and an inverter, the latch circuit being made up of two n-MOS transistors and two p-MOS transistors, and which shifts an input signal of the power supply voltage level to the power supply voltage level and shifts an input signal of the reference voltage level to a second negative voltage level;

second shift means which comprises a latch circuit and an inverter, the latch circuit being made up of two n-MOS transistors and two p-MOS transistors and which shifts the second negative voltage level to the reference voltage level and shifts the reference voltage level to the first negative voltage level; and an inverter which shifts the power supply voltage level obtained by the first shift means to the second negative voltage level and shifts the second negative voltage level obtained by the first shift means to the reference voltage level and then feeds the resulting voltage level to the second shift means.

2. A negative voltage level shifter circuit for shifting an input signal of either a power supply voltage level or a reference voltage level to either the reference voltage level or a first negative voltage level, comprising:

first shift means which comprises a latch circuit, an inverter and a p-MOS transistor that inhibits a second negative voltage from being biased forward, the latch circuit being made up of two n-MOS transistors and one p-MOS transistor, and which shifts an input signal of the power supply voltage level to the power supply voltage level and shifts an input signal of the reference voltage level to the second negative voltage level; and second shift means which comprises a latch circuit, an inverter and a p-MOS transistor that inhibits the second negative voltage from being biased forward, the latch circuit being made up of two n-MOS transistors And one p-MOS transistor, and which shifts the power supply voltage level to the reference voltage level and shifts the second negative voltage level to the first negative voltage level.

3. The negative voltage level shifter circuit according to claim 1, wherein the second negative voltage is so set as to have an absolute value equal to or smaller than a difference between an absolute value of a breakdown voltage of the transistors constituting the first shift means and an absolute value of the power supply voltage.

4. The negative voltage level shifter circuit according to claim 1, wherein the second negative voltage is obtained by a threshold reduction of at least one of the p-MOS transistors connected in series to each other.

5. A nonvolatile semiconductor storage device comprising the negative voltage level shifter circuit as defined in claim 1.

* * * * *